(12) United States Patent
Chang et al.

(10) Patent No.: US 6,218,689 B1
(45) Date of Patent: Apr. 17, 2001

(54) METHOD FOR PROVIDING A DOPANT LEVEL FOR POLYSILICON FOR FLASH MEMORY DEVICES

(75) Inventors: Kent Kuohua Chang, Cupertino; Kenneth Wo-Wai Au, Fremont; Hao Fang, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/369,638

(22) Filed: Aug. 6, 1999

(51) Int. Cl.[7] .......................... H01L 29/76; H01L 29/94; H01L 31/062; H01L 21/336

(52) U.S. Cl. .......................... 257/288; 257/340; 257/364; 257/407; 438/257

(58) Field of Search ...................................... 257/288, 314, 257/321, 340, 364, 407, 412, 558, 611, 927; 438/257

(56) References Cited

U.S. PATENT DOCUMENTS

| | | | |
|---|---|---|---|
| 4,597,159 | * | 7/1986 | Usami et al. ............................ 29/571 |
| 4,899,205 | * | 2/1990 | Hamdy et al. .......................... 357/51 |
| 5,424,232 | | 6/1995 | Yamauchi . |
| 5,511,020 | | 4/1996 | Hue et al. . |
| 5,677,867 | | 10/1997 | Hazani . |
| 5,866,930 | * | 2/1999 | Saida et al. ........................... 257/316 |
| 6,023,085 | * | 2/2000 | Fang ...................................... 257/315 |

FOREIGN PATENT DOCUMENTS

| | | |
|---|---|---|
| 0612108 | 8/1994 | (EP) . |
| 0663695 | 7/1995 | (EP) . |

\* cited by examiner

Primary Examiner—Matthew Smith
Assistant Examiner—Lex H. Malsawma
(74) Attorney, Agent, or Firm—Sawyer Law Group LLP (57) ABSTRACT

The present invention provides a method and a NAND-type flash memory device. The method includes forming a select gate oxide layer in a select transistor area of a substrate and a tunnel oxide layer in a memory cell area of the substrate; forming a doped amorphous silicon layer on the select gate oxide layer and the tunnel oxide layer, the doped amorphous silicon layer having a dopant level which simultaneously avoids a select transistor word line high resistance problem and a charge gain/charge loss problem; forming an insulating layer on the doped amorphous silicon layer; forming a control gate layer on the insulating layer; and etching at least the doped amorphous silicon layer, the insulating layer, and the control gate layer to form at least one memory cell stack structure and at least one select transistor stack structure. In a preferred embodiment, the polysilicon layer which forms both the floating gate of the flash memory cell and the select gate of the select transistor of the device is doped with between approximately $5 \times 10^{18}$ and $8 \times 10^{19}$ ions/cm$^3$ of phosphorus. With this dopant level, the contact resistance of the select transistor's control gate is low, thus keeping the word line resistivity of the device low. Simultaneously, contamination of the tunnel oxide of the flash memory cell by the dopant is limited, allowing for the interface between the floating gate and the tunnel oxide to be smooth, which prevents charge gain/loss problems. Thus, the reliability of the device is increased.

30 Claims, 7 Drawing Sheets

METHOD FOR PROVIDING A DOPANT LEVEL FOR POLYSILICON FOR FLASH MEMORY DEVICES

FIELD OF THE INVENTION

The present invention relates to flash memory devices, and more particularly to NAND-type flash memory devices.

BACKGROUND OF THE INVENTION

Figure 1A:
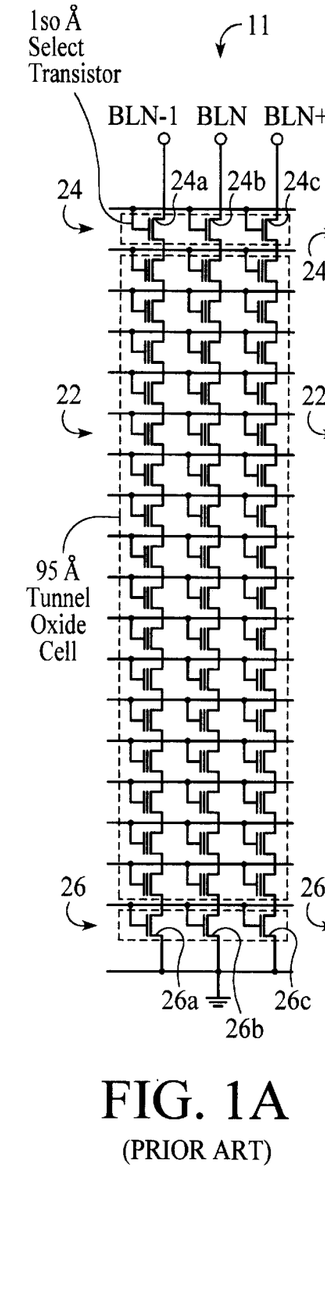
FIGS. 1A–1B illustrate conventional memory cells within the core region in a NAND-type circuit configuration.
Figure 1B:
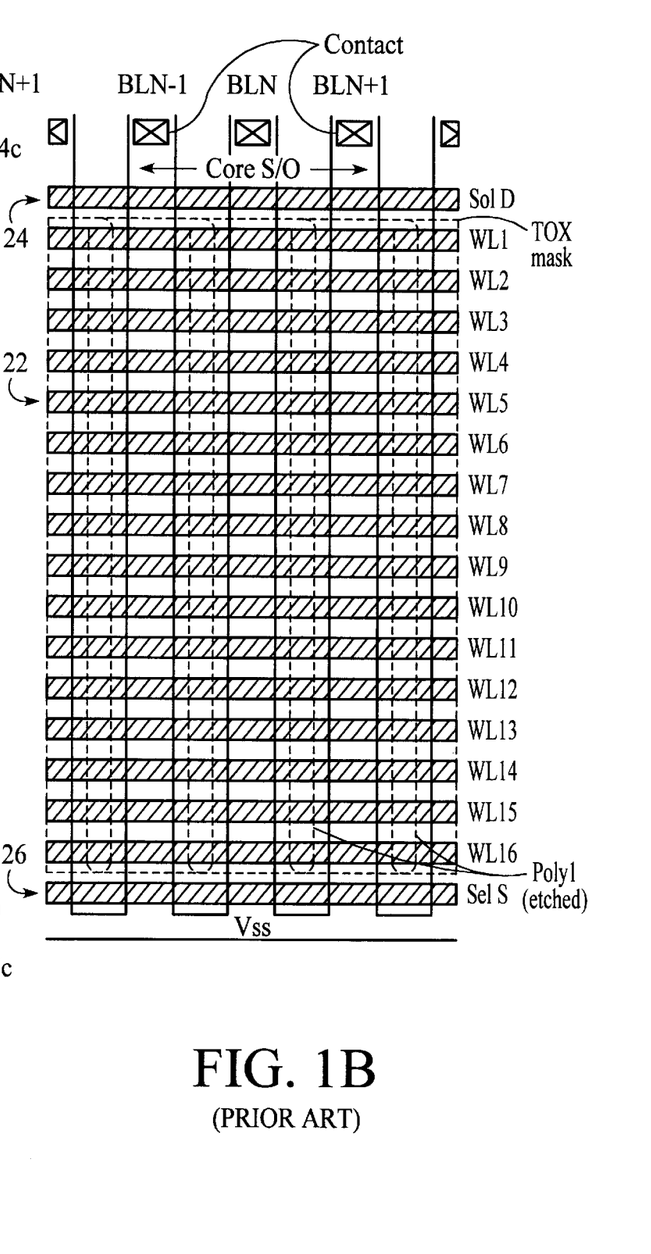

Semiconductor flash memory devices include NAND-type flash memory devices. Such memory devices typically comprise a high density core region and a low density peripheral region on a single substrate. The memory cells within the core region are coupled together in a NAND-type circuit configuration, as illustrated in FIGS. 1A and 1B. FIG. 1A illustrates a circuit schematic diagram of the core region 11 while FIG. 1B illustrates a plan view of the core region 11. The core region 11 includes a memory cell region 22 which is bounded on one side by a drain select transistor portion 24 and bounded on another side by a source select transistor portion 26. Each of the select transistor portions 24 and 26 contain select gate transistors 24a–24c and 26a–26c, respectively, which operate to selectively activate a desired bit line.

Figure 1C:
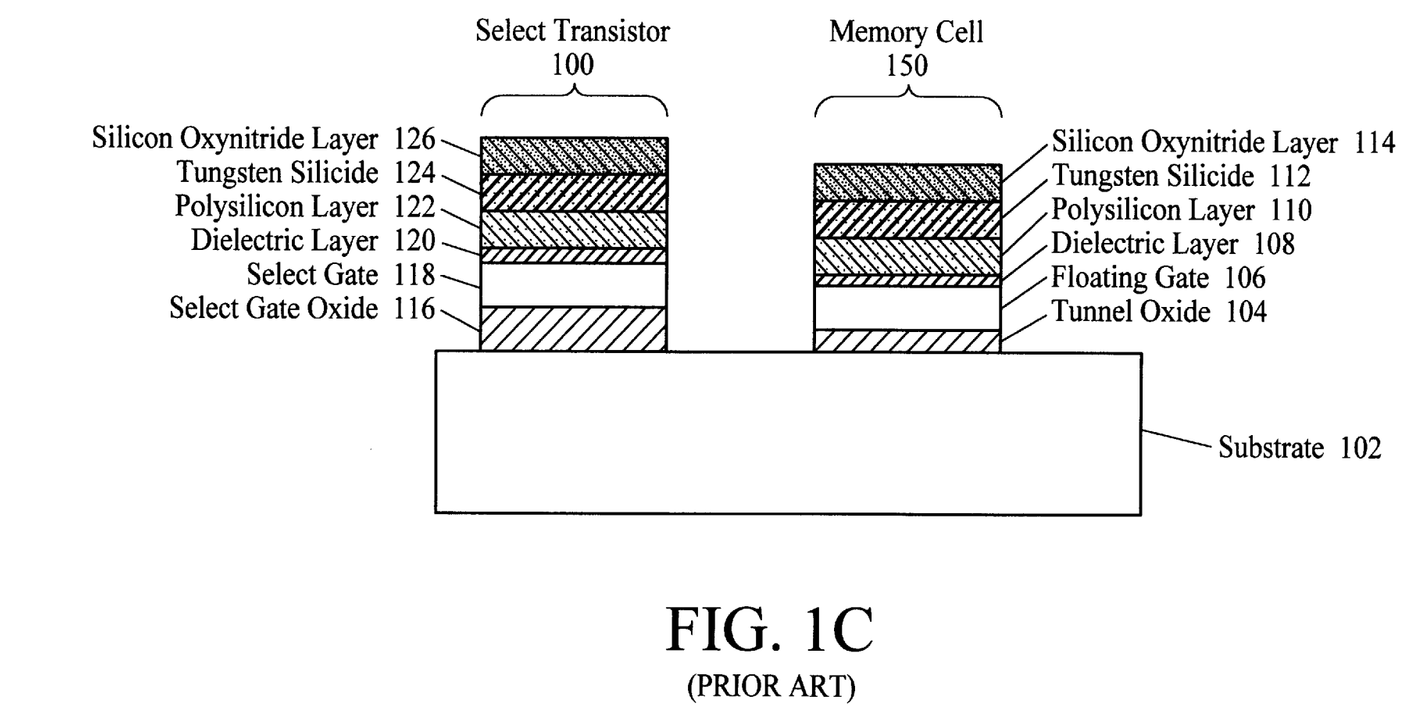
FIG. 1C illustrates a cross-section of conventional stack structures of a select transistor and a memory cell in the core region.

FIG. 1C illustrates a cross-section of conventional stack structures of a select transistor 100 and a memory cell 150 in the core region 11. The stack structure 150 of the memory cell includes a tunnel oxide 104 on a substrate 102 and a floating gate 106 composed of polysilicon on the tunnel oxide 104. The control gate comprises a polysilicon layer 110 and a tungsten silicide layer 112 on the polysilicon layer 110. A dielectric layer insulates the floating gate 106 from the control gate 110 and 112. The control gate 110 and 112 is coupled to a word line. A cap layer 114 composed of silicon oxynitride resides on the control gate 110 and 112 and provides an anti-reflective coating at masking.

The stack structure 100 of the select transistor comprises a select gate oxide 116 on the substrate 102. A select gate 118 is on the select gate oxide 116. Like the memory cell stack structure 150, the control gate of the select transistor includes a polysilicon layer 122 and a tungsten silicide layer 124. A dielectric layer 120 insulates the select gate 118 from the control gate 122 and 124. The stack structure 100 is topped by a silicon oxynitride layer 126.

Typically, the floating gate 106 of the memory cell stack structure 150 and the select gate 118 of the select transistor stack structure 100 are formed from a single in-situ doped polysilicon layer. Subsequent masking and etching provides the resulting floating gate 106 and the select gate 118. In order to properly perform the programming and erasure of the memory cell, this single polysilicon layer must be conductive. It may be rendered conductive by using doped amorphous silicon for the single polysilicon layer. The dopant level of the single polysilicon layer is critical in the performance of the memory cell and thus the semiconductor device as a whole.

However, there are two conflicting factors in determining the level of dopant for the single polysilicon layer. If the dopant level is too low, this will cause the control gate contact resistance of the select transistor to become too high since the select gate 118 is connected to the control gate 122 and 124 via an interconnect (not shown). This causes the select transistor word line resistance to also become too high, resulting in a slower circuit performance. If the dopant level is too high, some of the dopant will contaminate the tunnel oxide 104 of the memory cell, which causes the surface of the floating gate 106 and tunnel oxide 104 interface to be rough. The rough interface leads to a high local electric field and a lower oxide dielectric strength. This causes reliability problems and a charge gain/loss problem in the programming and erasure of the memory cell.

Accordingly, there exists a need for a method and NAND-type flash memory device for providing a polysilicon dopant level which avoids both the select transistor word line high resistance and the charge gain/loss problems. The present invention addresses such a need.

SUMMARY OF THE INVENTION

The present invention provides a method and a NAND-type flash memory device. The method includes forming a select gate oxide layer in a select transistor area of a substrate and a tunnel oxide layer in a memory cell area of the substrate; forming a doped amorphous silicon layer on the select gate oxide layer and the tunnel oxide layer, the doped amorphous silicon layer having a dopant level which simultaneously avoids a select transistor word line high resistance problem and a charge gain/charge loss problem; forming an insulating layer on the doped amorphous silicon layer; forming a control gate layer on the insulating layer; and etching at least the doped amorphous silicon layer, the insulating layer, and the control gate layer to form at least one memory cell stack structure and at least one select transistor stack structure. In a preferred embodiment, the polysilicon layer which forms both the floating gate of the flash memory cell and the select gate of the select transistor of the device is doped with between approximately $5 \times 10^{18}$ and $8 \times 10^{19}$ ions/cm$^3$ of phosphorus. With this dopant level, the contact resistance of the select transistor's control gate is low, thus keeping the word line resistivity of the device low. Simultaneously, contamination of the tunnel oxide of the flash memory cell by the dopant is limited, allowing for the interface between the floating gate and the tunnel oxide to be smooth, which prevents charge gain/loss problems. Thus, the reliability of the device is increased.

DETAILED DESCRIPTION

The present invention provides a method and NAND-type flash memory device for providing a polysilicon dopant level which avoids both the select transistor word line high resistance and the charge gain/loss problems. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The method in accordance with the present invention avoids the select transistor word line high resistance and the charge gain/loss problems by providing a polysilicon layer dopant level between approximately $5 \times 10^{18}$ and $8 \times 10^{19}$ ions/cm$^3$ of phosphorus. Preferably, the select transistor word line resistance is no greater than approximately 1500 ohm/sq. To more particularly describe the features of the present invention, please refer to FIGS. 2 through 3I in conjunction with the discussion below.

Figure 2:
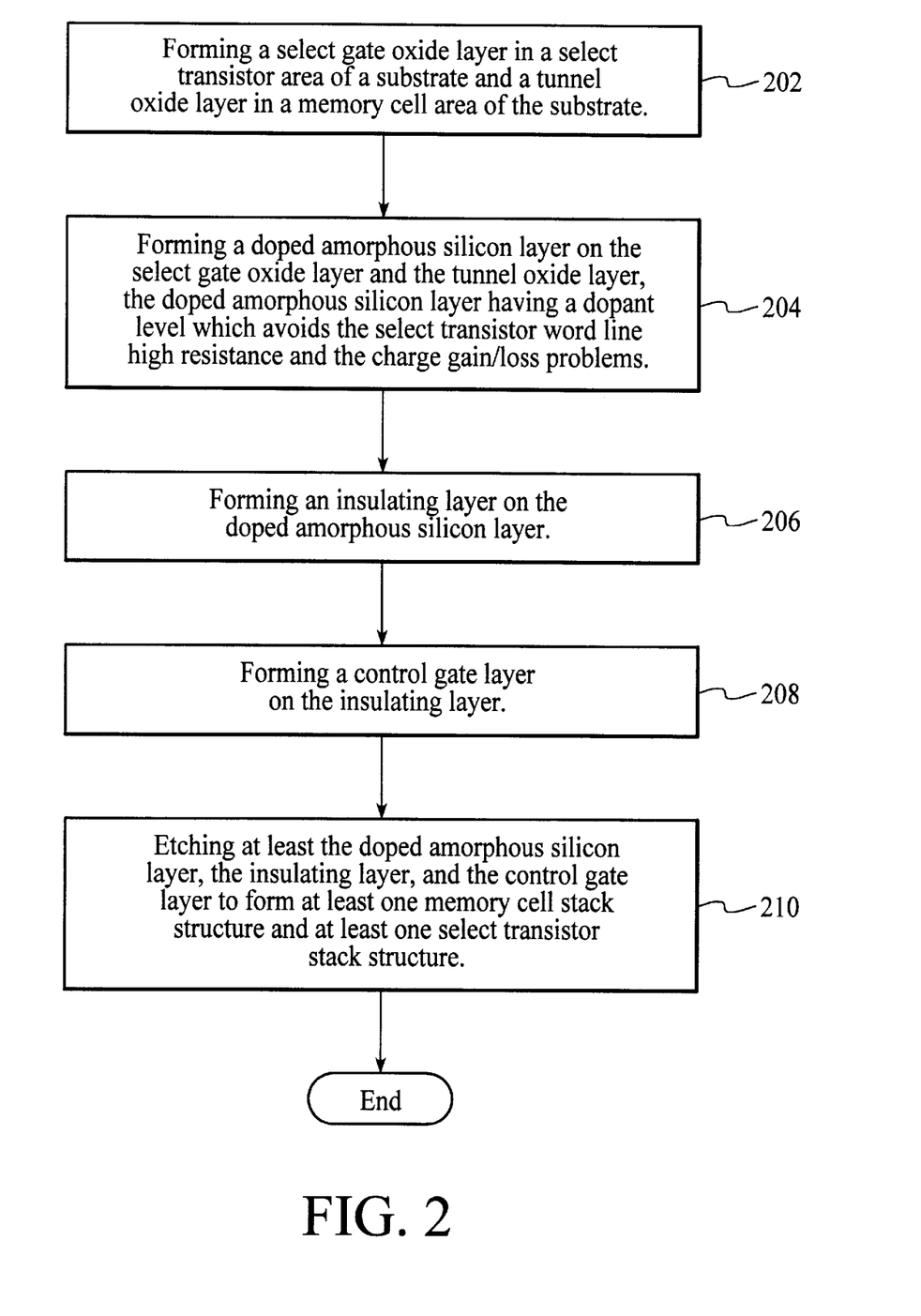
FIG. 2 is a flow chart illustrating a method of providing a NAND-type flash memory device in accordance with the present invention.

FIG. 2 is a flow chart illustrating a method of providing a NAND-type flash memory device in accordance with the present invention. First, a select gate oxide layer in a select transistor area of a substrate and a tunnel oxide layer in a memory cell area of the substrate is formed, via step 202. Next, a doped amorphous silicon layer is formed on the select gate oxide layer and the tunnel oxide layer, via step 204. The doped amorphous silicon layer has a dopant level which simultaneously avoids the select transistor word line high resistance and the charge gain/loss problems. In the preferred embodiment, the dopant level is between $5 \times 10^{18}$ and $8 \times 10^{19}$ ions/cm$^3$ of phosphorus. Then, an insulating layer is formed on the doped amorphous silicon layer, via step 206, and a control gate layer is formed on the insulating layer, via step 208. To form the memory cell and select transistor stack structures, at least the doped amorphous silicon layer, the insulating layer, and the control gate layer is etched, via step 210.

With the method of providing a NAND-type flash memory device in accordance with the present invention, both the floating gate of the memory cell and the select gate of the select transistor are formed with the same doped amorphous silicon layer. With a dopant level between approximately $5 \times 10^{18}$ and $8 \times 10^{19}$ ions/cm$^3$ of phosphorus, the contact resistance of the select transistor's control gate is low, thus keeping the select transistor word line resistivity of the device low. Simultaneously, contamination of the tunnel oxide of the flash memory cell by the dopant is limited, allowing for the interface between the floating gate and the tunnel oxide to be smooth, which prevents charge gain/loss problems.

Although the present invention is described with the use of phosphorus ions, one of ordinary skill in the art will understand that other ions may be used, such as arsenic ions, without departing from the spirit and scope of the present invention.

FIGS. 3A–3I illustrate cross-sections of a portion of a memory device core region along a bit line in demonstration of a preferred embodiment of the method for providing a NAND-type memory device in accordance with the present invention. Although only cross-sections of a portion of the core region is illustrated, one of ordinary skill in the art will understand that a plurality of select transistors and memory cells may be fabricated in a similar manner.

Figure 3A:
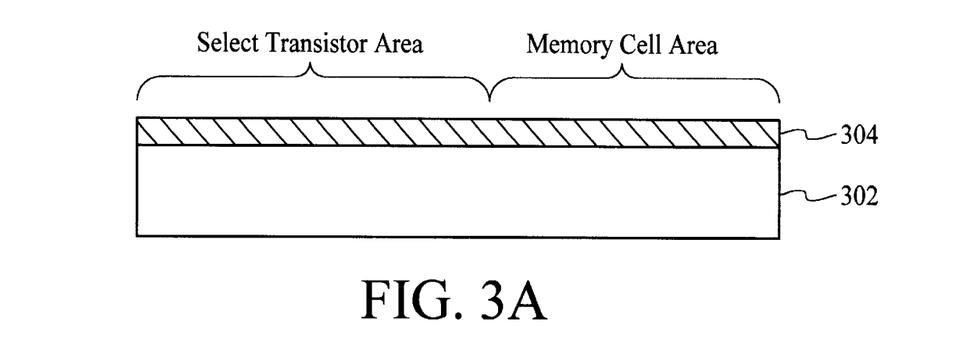
FIGS. 3A–3I illustrate cross-sections of a portion of a memory device core region along a bit line in demonstration of a preferred embodiment of the method for providing a NAND-type memory device in accordance with the present invention.

FIGS. 3A–3D illustrate the formation of the select gate layer and the tunnel oxide layer, via step 202. First, as illustrated in FIG. 3A, a first oxide layer 304 is grown on at least part of the substrate 302. The substrate 302 has a select transistor area and a memory cell area. Oxide grown in the select transistor area will eventually become the select gate oxide of the select transistor while oxide formed in the memory cell area will eventually become the tunnel oxide of the memory cell. In the preferred embodiment, approximately 148 Å of the first oxide layer 304 is grown on the substrate 302 using dry oxidation at about 900° C. with an atmosphere of about 1.33 liters of $O_2$, 70 cc of HCl, and 12.6 liters of Ar.

Figure 3B:
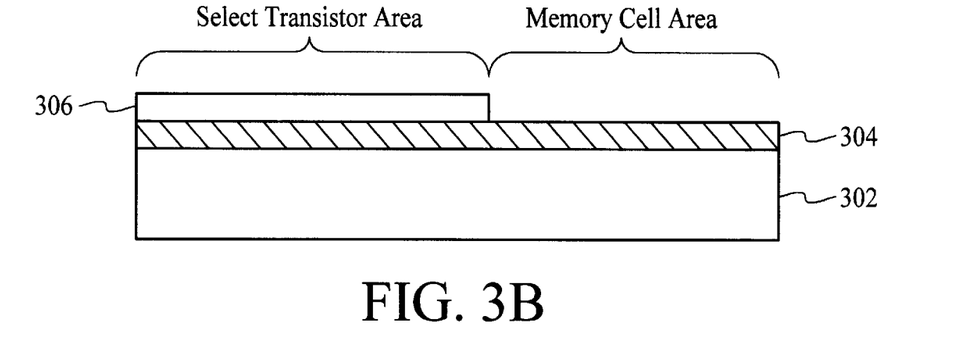
Figure 3C:
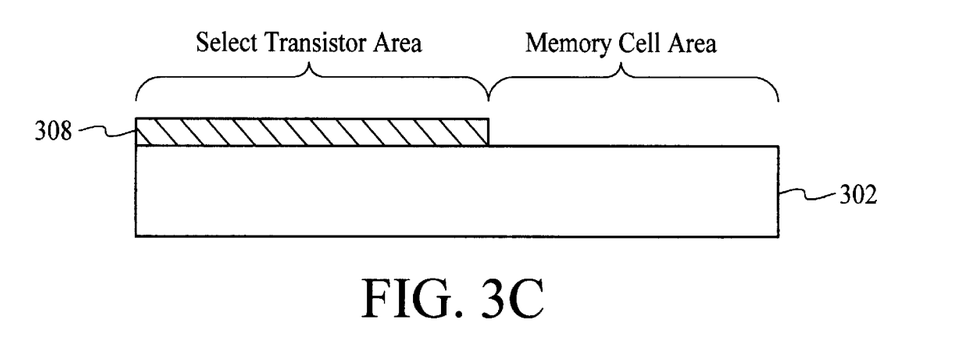

Next, as illustrated in FIG. 3B, a mask 306 is placed over a part of the first oxide layer 304. In the preferred embodiment, the mask 306 is placed over the first oxide layer in the select transistor area, leaving the first oxide layer in the memory cell area exposed. An etch is then performed, removing the unmasked portion of the first oxide layer 304. The mask 306 is then removed. As illustrated in FIG. 3C, the result is the first oxide layer 308 in the select transistor area while the memory cell area has bare silicon substrate.

Figure 3D:
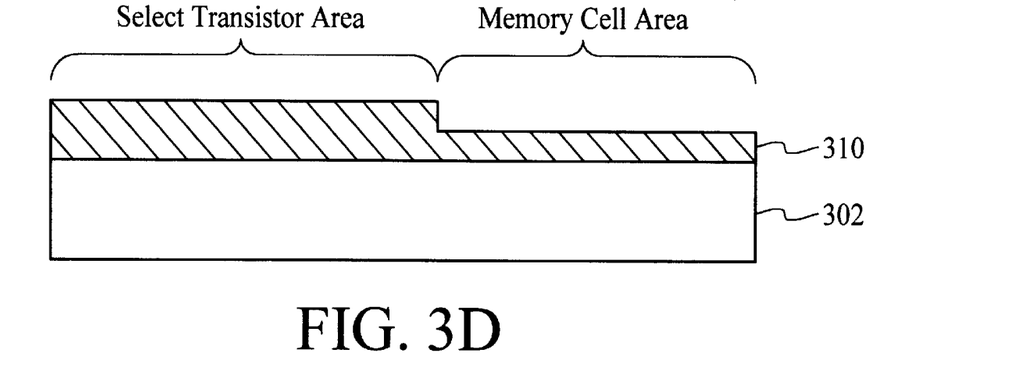

Next, a second oxide layer is grown on the first oxide layer 308 and the substrate 302, as illustrated in FIG. 3D. In the preferred embodiment, dry oxidation techniques are used at about 1050° C. with an atmosphere of about 1.33 liters of $O_2$, 70 cc of HCl, and 12.6 liters of Ar. The result is a combined oxide layer 310 which comprises a thin layer of oxide, the tunnel oxide layer, in the memory cell area of approximately 87 Å, and a thicker layer of oxide, the select gate layer, in the select transistor area of approximately 168 Å.

Figure 3E:
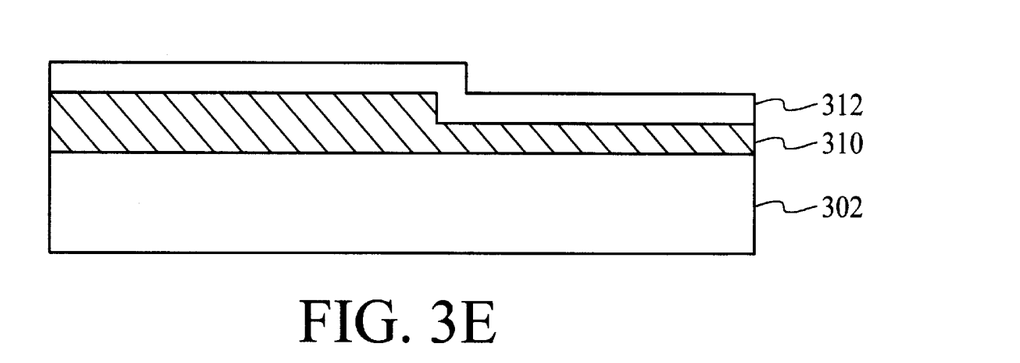

FIG. 3E illustrates the forming of a doped amorphous silicon layer, via step 204. In this step, a doped amorphous silicon layer 312 is deposited on the select oxide layer 310. In the preferred embodiment, approximately 700 Å of the doped amorphous silicon layer 312 is deposited using low pressure chemical vapor deposition (LPCVD) techniques at about 450–580° C., preferably 530° C., and 300–550 mT, preferably 400 mT, with about 1200–3000 sccm of $SiH_4$, preferably 2000 sccm, and 15–30 sccm of a mixture of 1% by weight of $PH_3$ in He, preferably 22 sccm. The amorphous silicon layer 312 is doped in-situ, i.e., doped during its formation, with a dopant level between $5 \times 10^{18}$ and $8 \times 10^{19}$ ions/cm$^3$ of phosphorus. The dopant level of the amorphous silicon layer 312 is a critical factor in the functioning of the device.

Figure 3F:
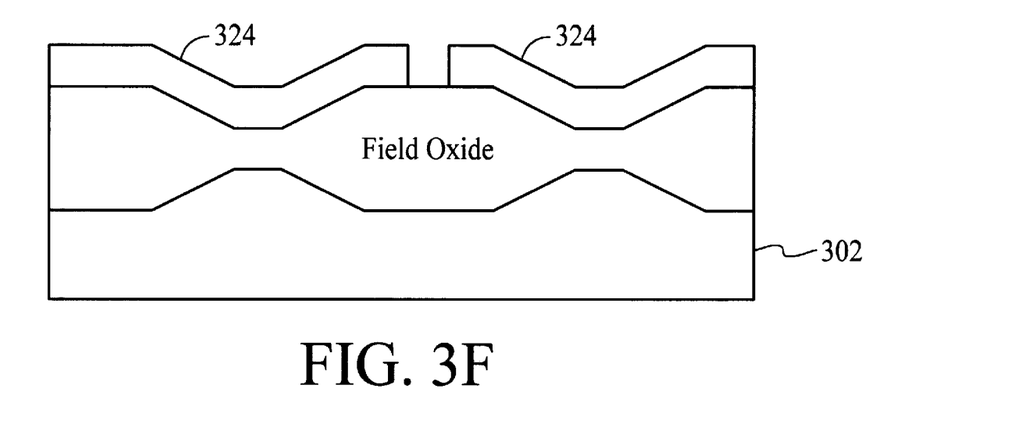

At this point, portions of the doped amorphous silicon layer 312 is etched away to define the floating gates of the memory cells. The etch is performed at about 125 mT and 120 W with about 30 sccm of $Cl_2$, and 70 sccm of HBr. The result is an isolation of portions of the doped amorphous silicon layer 312 along the bit line, defining floating gates for the memory cells along the bit lines. FIG. 3F illustrates a cross-section along the word line illustrating the floating gates 324.

Figure 3G:
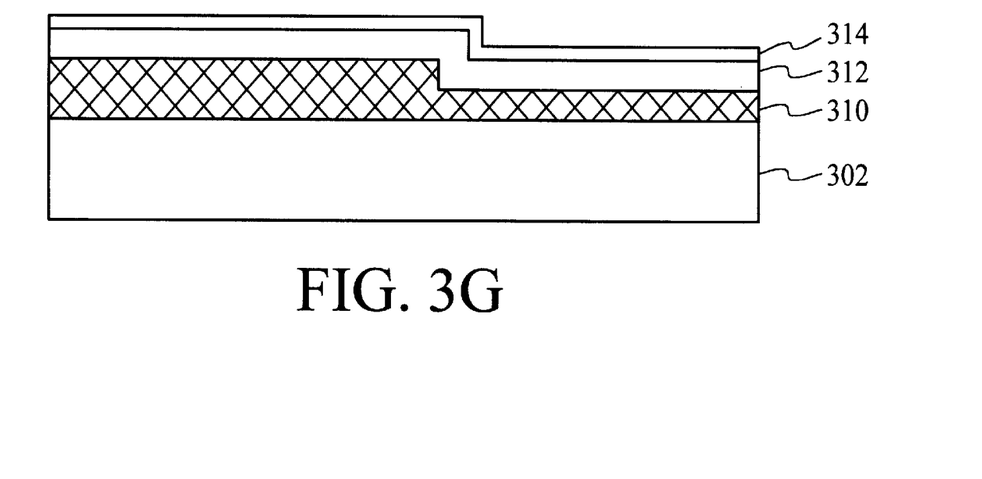

FIG. 3G illustrates the formation of the insulating layer, via step 206, on the first doped amorphous silicon layer 312. In the preferred embodiment, the insulating layer 314 is a dielectric layer comprised of two oxide layers with a layer of nitride sandwiched in-between, called an ONO layer. Approximately 50 Å of the first of the two oxide layers is first deposited on the doped amorphous silicon layer 312 at about 750° C. and 600 mT with about 20 cc of $SiH_4$, and 1.2 liters of $N_2O$. Then approximately 80 Å of the nitride layer is deposited at about 760° C. and 330 mT with about 600 cc of $NH_3$, and 100 cc of $SiH_2Cl_2$. The second of the two oxide layers of the dielectric layer 314 is formed using a nitride oxidation technique at about 950° C. with about 5 liters of $O_2$, and 9 liters of $H_2$ for about 40 minutes, which grows approximately 50 Å of oxide. The result is approximately 135 Å of dielectric layer 314.

Figure 3H:
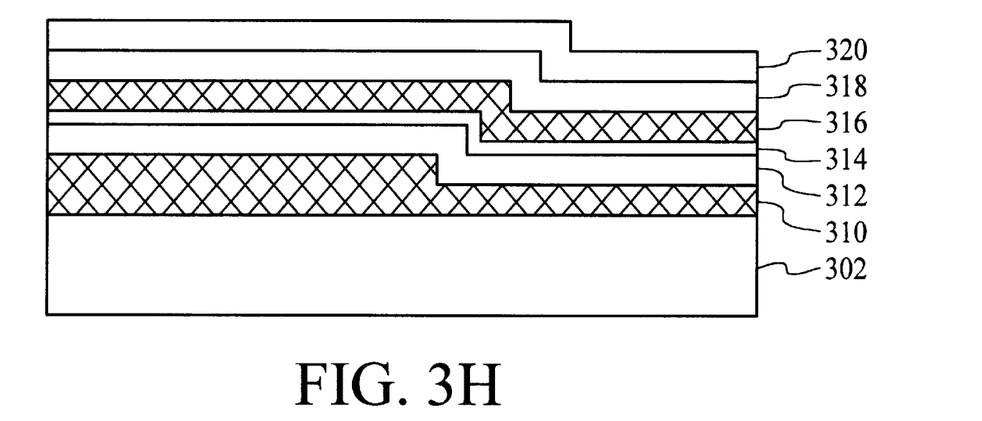

FIG. 3H illustrates the formation of the control gate layer, via step 208. First, a polysilicon layer 316 is deposited on the dielectric layer 314. The polysilicon layer 316 may be comprised of doped amorphous silicon. Then, a tungsten silicide layer 318 is deposited on the polysilicon layer 316, and a silicon oxynitride layer 320 is deposited on the tungsten silicide layer 318. In the preferred embodiment, approximately 1200 Å of the polysilicon layer 316 is deposited. With a polysilicon layer comprised of doped amorphous silicon, the layer 316 is deposited using LPCVD techniques at about 530° C. and 400 mT with about 2000 sccm of $SiH_4$, and 75 sccm of a mixture of 1% by weight of $PH_3$ in He. Approximately 1500 Å of the tungsten silicide layer 318 is deposited at about 360° C. and 200 mT with about 500 sccm of $SiH_4$, and 50 sccm of Ar. Approximately 1000 Å of the silicon oxynitride layer 320 is deposited at about 400° C., 300–340 W, and 3.5 mT with about 90–110 sccm of $SiH_4$, 450–550 sccm of $N_2$, and 35–45 sccm of $N_2O$. A silicon oxynitride layer 320 with a reflectivity index between 2.0 and 2.34 is desirable. The silicon oxynitride layer 320 may also be bombarded with $N_2O$ to promote the ease of removal of any subsequent photoresist during photolithography.

Figure 3I:
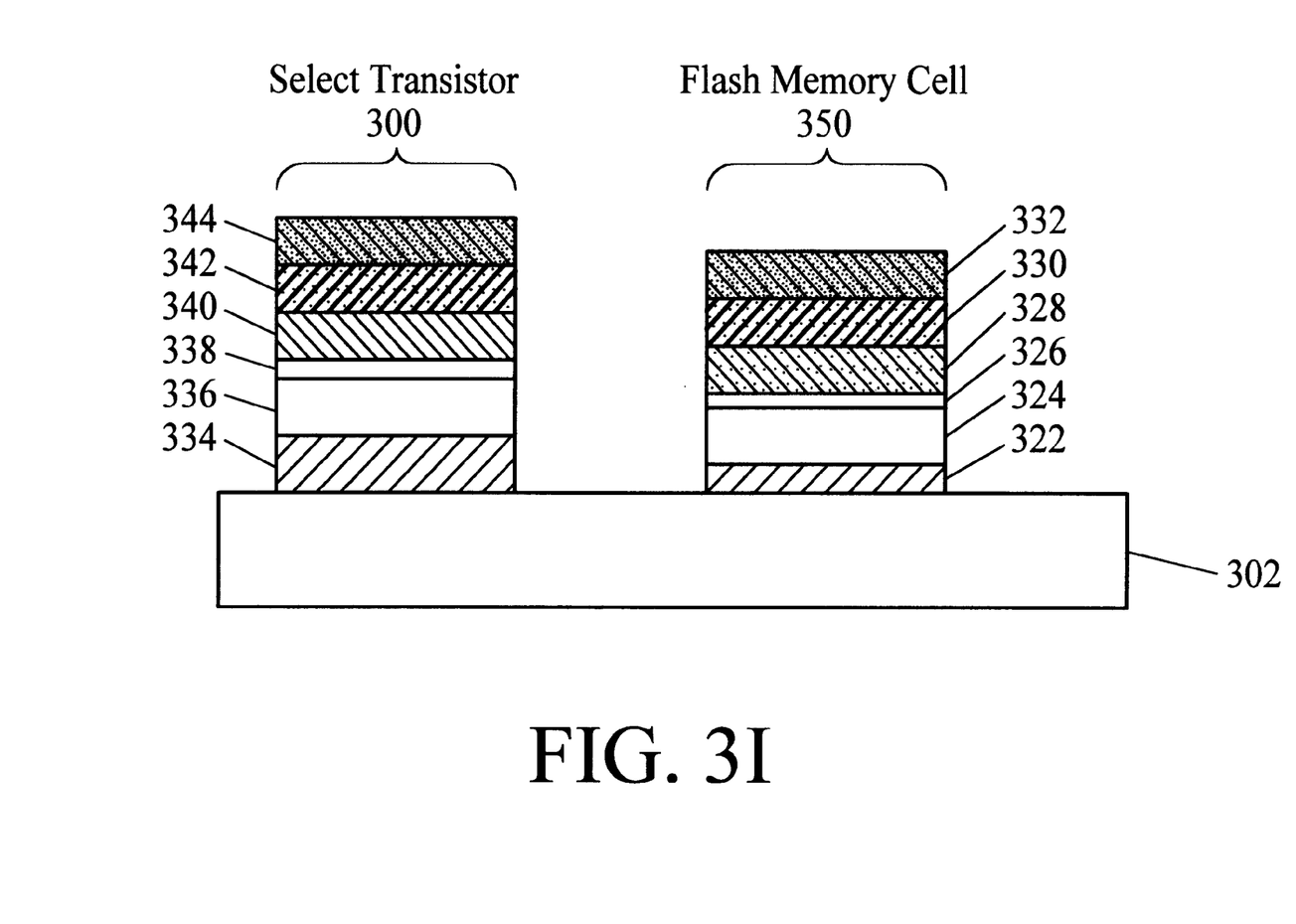

Then, a series of masking and etching steps are performed to form the stacked structures 300 and 350 of the select transistor and memory cell respectively, via step 210, illustrated in FIG. 3I. The resulting memory cell stack structure 350 in accordance with the present invention comprises a tunnel oxide 322, formed from the oxide layer 310; a floating gate 324 with a dopant level between approximately $5 \times 10^{18}$ and $8 \times 10^{19}$ ions/cm$^3$ of phosphorus, formed from the doped amorphous silicon layer 312; an insulating layer 326; a polysilicon layer 328; a tungsten silicide layer 330; and a silicon oxynitride layer 332.

The resulting select transistor stack structure 350 in accordance with the present invention comprises a select gate oxide layer 334 formed from the oxide layer 310; a select gate 336 with a dopant level between approximately $5 \times 10^{18}$ and $8 \times 10^{19}$ ions/cm$^3$ of phosphorus, formed from the doped amorphous silicon layer 312; an insulating layer 338; a polysilicon layer 340; a tungsten silicide layer 342; and a silicon oxynitride layer 344.

Both the floating gate 324 and the select gate 336 are formed from the same doped amorphous silicon layer 312, which has a dopant level between approximately $5 \times 10^{18}$ and $8 \times 10^{19}$ ions/cm$^3$ of phosphorus. With this dopant level, both word line high resistance and charge gain/loss problems are avoided.

A NAND-type flash memory device and a method for providing such a device has been disclosed. A preferred embodiment of the polysilicon layer which forms both the floating gate of the flash memory cell and the select gate of the select transistor of the device is doped with between approximately $5 \times 10^{18}$ and $8 \times 10^{19}$ ions/cm$^3$ of phosphorus. With this dopant level, the contact resistance of the select transistor's control gate is low, thus keeping the word line resistivity of the device low. Simultaneously, contamination of the tunnel oxide of the flash memory cell by the dopant is limited, allowing for the interface between the floating gate and the tunnel oxide to be smooth, which prevents charge gain/loss problems. Thus, the reliability of the device is increased.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a NAND-type flash memory device, comprising:
   (a) forming a select gate oxide layer in a select transistor area of a substrate and a tunnel oxide layer in a memory cell area of the substrate;
   (b) forming a doped amorphous silicon layer on the select gate oxide layer and the tunnel oxide layer, the doped amorphous silicon layer having a dopant level which simultaneously avoids a select transistor word line resistance problem and a charge gain/charge loss problem wherein the doped amorphous silicon layer has a dopant level between approximately $5 \times 10^{18}$ and $8 \times 10^{19}$ ions/cm$^3$ of phosphorus, and wherein the select transistor word line resistance is no greater than approximately 1500 ohms per square;
   (c) forming an insulating layer on the doped amorphous silicon layer;
   (d) forming a control gate layer on the insulating layer; and
   (e) etching at least the doped amorphous silicon layer, the insulating layer, and the control gate layer to form at least one memory cell stack structure and at least one select transistor stack structure.

2. The method of claim 1, wherein the forming step (a) comprises:
   (a1) growing a first oxide layer in the select transistor area and the memory cell area;
   (a2) removing the first oxide layer in the memory cell area; and
   (a3) growing a second oxide layer on the first oxide layer in the select transistor area and the substrate in the memory cell area.

3. The method of claim 2, wherein the removing step (a2) comprises:
   (a2i) placing a mask on the first oxide layer in the select transistor area;
   (a2ii) etching the first oxide layer in the memory cell area; and
   (a2iii) removing the mask.

4. The method of claim 1, wherein the doped amorphous silicon layer is formed using low pressure chemical vapor deposition techniques at about 450–580° C. and 300–550 mT with about 1200–3000 sccm of $SiH_4$ and 15–30 sccm of a mixture of 1% by weight of $PH_3$ in He.

5. The method of claim 1, wherein the forming step (c) comprises:
   (c1) depositing a first dielectric oxide layer on the doped amorphous silicon layer;
   (c2) depositing a nitride layer on the first dielectric oxide layer; and
   (c3) growing a second dielectric oxide layer on the nitride layer.

6. The method of claim 1, wherein the forming step (d) comprises:
   (d1) growing a second doped amorphous silicon layer on the insulating layer; and
   (d2) growing a tungsten silicide layer on the second doped amorphous silicon layer.

7. A NAND-type flash memory device, comprising:
   a substrate;
   at least one memory cell stack structure on the substrate, comprising:
      a tunnel oxide layer, a floating gate on the tunnel oxide layer comprising doped amorphous silicon, the doped amorphous silicon having a dopant level which simultaneously avoids a select transistor word line resistance problem and a charge gain/charge loss problem, wherein the doped amorphous silicon has a dopant level between approximately $5 \times 10^{18}$ and $8 \times 10^{19}$ ions/cm$^3$ of phosphorus, and wherein the select transistor word line resistance is no greater than approximately 1500 ohms per square, a first insulating layer on the floating gate, and a first control gate layer on the first insulating layer; and at least one select transistor stack structure on the substrate, comprising:

a select gate oxide layer on the substrate, a select gate on the select gate oxide layer comprising the doped amorphous silicon, a second insulating layer on the select gate, and a second control gate layer on the second insulating layer.

8. The device of claim 7, wherein the doped amorphous silicon is formed using low chemical vapor deposition techniques at about 450–580° C. and 300–550 mT with about 1200–3000 sccm of SiH$_4$ and 15–30 sccm of a mixture of 1% by weight of PH$_3$ in He.

9. The device of claim 7, wherein the first insulating layer comprises:

a first dielectric oxide layer on the floating gate;

a nitride layer on the first dielectric oxide layer; and a second dielectric oxide layer on the nitride layer.

10. The device of claim 7, wherein the second insulating layer comprises:

a first dielectric oxide layer on the select gate;

a nitride layer on the first dielectric oxide layer; and a second dielectric oxide layer on the nitride layer.

11. The device of claim 7, wherein the first control gate layer comprises:

a polysilicon layer on the first insulating layer; and a tungsten silicide layer on the polysilicon layer.

12. The device of claim 7, wherein the second control gate layer comprises:

a polysilicon layer on the second insulating layer; and a tungsten silicide layer on the polysilicon layer.

13. The device of claim 7, wherein the at least one memory cell stack structure further comprises:

a silicon oxynitride layer on the first control gate layer.

14. The device of claim 7, wherein the at least one select transistor stack structure further comprises:

a silicon oxynitride layer on the second control gate layer.

15. A method for providing a NAND-type flash memory device, comprising:

(a) forming a select gate oxide layer in a select transistor area of a substrate and a tunnel oxide layer in a memory cell area of the substrate;

(b) forming a doped amorphous silicon layer on the select gate oxide layer and the tunnel oxide layer, wherein the doped amorphous silicon layer has a dopant level between approximately $5 \times 10^{18}$ and $8 \times 10^{19}$ ions/cm$^3$ of phosphorus;

(c) forming an insulating layer on the doped amorphous silicon layer;

(d) forming a control gate layer on the insulating layer; and (e) etching at least the doped amorphous silicon layer, the insulating layer, and the control gate layer to form at least one memory cell stack structure and at least one select transistor stack structure, wherein the select transistor word line resistance is no greater than approximately 1500 ohms per square.

16. The method of claim 15, wherein the forming step (a) comprises:

(a1) growing a first oxide layer in the select transistor area and the memory cell area;

(a2) removing the first oxide layer in the memory cell area; and (a3) growing a second oxide layer on the first oxide layer in the select transistor area and the substrate in the memory cell area.

17. The method of claim 16, wherein the removing step (a2) comprises:

(a2i) placing a mask on the first oxide layer in the select transistor area;

(a2ii) etching the first oxide layer in the memory cell area; and (a2iii) removing the mask.

18. The method of claim 15, wherein the doped amorphous silicon layer is formed using low pressure chemical vapor deposition techniques at about 450–580° C. and 300–550 mT with about 1200–3000 sccm of SiH$_4$ and 15–30 sccm of a mixture of 1% by weight of PH$_3$ in He.

19. The method of claim 15, wherein the forming step (c) comprises:

(c1) depositing a first dielectric oxide layer on the doped amorphous silicon layer;

(c2) depositing a nitride layer on the first dielectric oxide layer; and (c3) growing a second dielectric oxide layer on the nitride layer.

20. The method of claim 15, wherein the forming step (d) comprises:

(d1) growing a polysilicon layer on the insulating layer; and (d2) growing a tungsten silicide layer on the polysilicon layer.

21. A NAND-type flash memory device, comprising:

a substrate;

at least one memory cell stack structure on the substrate, comprising:

a tunnel oxide layer, a floating gate on the tunnel oxide layer comprising doped amorphous silicon, wherein the doped amorphous silicon has a dopant level between approximately $5 \times 10^{18}$ and $8 \times 10^{19}$ ions/cm$^3$ of phosphorus, a first insulating layer on the floating gate, and a first control gate layer on the first insulating layer; and at least one select transistor stack structure on the substrate, wherein the select transistor word line resistance is no greater than approximately 1500 ohms per square, comprising:

a select gate oxide layer on the substrate, a select gate on the select gate oxide layer comprising the doped amorphous silicon, a second insulating layer on the select gate, and a second control gate layer on the second insulating layer.

22. The device of claim 21, wherein the doped amorphous silicon is formed using low chemical vapor deposition techniques at about 450–580° C. and 300–550 mT with about 1200–3000 sccm of SiH$_4$ and 15–30 sccm of a mixture of 1% by weight of PH$_3$ in He.

23. The device of claim 21, wherein the first insulating layer comprises:
   a first dielectric oxide layer on the floating gate;
   a nitride layer on the first dielectric oxide layer; and
   a second dielectric oxide layer on the nitride layer.

24. The device of claim 21, wherein the second insulating layer comprises:
   a first dielectric oxide layer on the select gate;
   a nitride layer on the first dielectric oxide layer; and
   a second dielectric oxide layer on the nitride layer.

25. The device of claim 21, wherein the first control gate layer comprises:
   a polysilicon layer on the first insulating layer; and
   a tungsten silicide layer on the polysilicon layer.

26. The device of claim 21, wherein the second control gate layer comprises:
   a polysilicon layer on the second insulating layer; and
   a tungsten silicide layer on the polysilicon layer.

27. The device of claim 21, wherein the at least one memory cell stack structure further comprises:
   a silicon oxynitride layer on the first control gate layer.

28. The device of claim 21, wherein the at least one select transistor stack structure further comprises:
   a silicon oxynitride layer on the second control gate layer.

29. A method for providing a NAND-type flash memory device, comprising:
   (a) growing a first oxide layer in a select transistor area of a substrate and a memory cell area of the substrate;
   (b) removing the first oxide layer in the memory cell area;
   (c) growing a second oxide layer on the first oxide layer in the select transistor area and the substrate in the memory cell area;
   (d) forming a doped amorphous silicon layer on the select gate oxide layer and the tunnel oxide layer, wherein the doped amorphous silicon layer has a dopant level between approximately $5\times10^{18}$ and $8\times10^{19}$ ions/cm$^3$ of phosphorus, wherein the doped amorphous silicon layer is formed using low pressure chemical vapor deposition techniques at about 450–580° C. and 300–550 mT with about 1200–3000 sccm of SiH$_4$ and 15–30 sccm of a mixture of 1% by weight of PH$_3$ in He;
   (e) forming an insulating layer on the doped amorphous silicon layer;
   (f) growing a polysilicon layer on the insulating layer;
   (g) growing a tungsten silicide layer on the polysilicon layer;
   (h) growing a silicon oxynitride layer on the tungsten silicide layer; and
   (i) etching at least the doped amorphous silicon layer, the insulating layer, the polysilicon layer, the tungsten silicide layer, and the silicon oxynitride layer to form at least one memory cell stack structure and at least one select transistor stack structure, wherein the select transistor word line resistance is no greater than approximately 1500 ohms per square.

30. A NAND-type flash memory device, comprising:
   a substrate;
   at least one memory cell stack structure on the substrate, comprising:
      a tunnel oxide layer,
      a floating gate on the tunnel oxide layer comprising doped amorphous silicon, wherein the doped amorphous silicon has a dopant level between approximately $5\times10^{18}$ and $8\times10^{19}$ ions/cm$^3$ of phosphorus, wherein the doped amorphous silicon is formed using low chemical vapor deposition techniques at 450–580° C. and 300–550 mT with about 1200–3000 sccm of SiH$_4$ and 15–30 sccm of a mixture of 1% by weight of PH$_3$ in He,
      a first insulating layer on the floating gate,
      a first polysilicon layer on the first insulating layer,
      a first tungsten silicide layer on the first polysilicon layer, and
      a first silicon oxynitride layer on the first tungsten silicide layer; and
   at least one select transistor stack structure on the substrate, wherein the select transistor word line resistance is no greater than approximately 1500 ohms per square, comprising:
      a select gate oxide layer on the substrate,
      a select gate on the select gate oxide layer comprising the doped amorphous silicon,
      a second polysilicon layer on the second insulating layer,
      a second tungsten silicide layer on the second polysilicon layer, and
      a second silicon oxynitride layer on the second tungsten silicide layer.

* * * * *